US012509762B2

(12) United States Patent
Breil et al.

(10) Patent No.: US 12,509,762 B2
(45) Date of Patent: Dec. 30, 2025

(54) OXIDATION BARRIERS WITH CVD SOAK PROCESSES

(71) Applicant: Applied Materials, Inc., Santa Clara, CA (US)

(72) Inventors: Nicolas Louis Breil, San Jose, CA (US); Yi-Chiau Huang, Fremont, CA (US); Jesus Avila Avendano, Dallas, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 336 days.

(21) Appl. No.: 18/209,257

(22) Filed: Jun. 13, 2023

(65) Prior Publication Data
US 2024/0018647 A1    Jan. 18, 2024

Related U.S. Application Data

(60) Provisional application No. 63/388,729, filed on Jul. 13, 2022.

(51) Int. Cl.
*C23C 16/02* (2006.01)
*H01L 21/768* (2006.01)
*H01L 23/532* (2006.01)

(52) U.S. Cl.
CPC .... *C23C 16/0245* (2013.01); *H01L 21/76849* (2013.01); *H01L 21/76879* (2013.01); *H01L 21/76897* (2013.01); *H01L 23/53266* (2013.01)

(58) Field of Classification Search
CPC .......... C23C 16/0245; H01L 21/76849; H01L 21/76879; H01L 21/6897; H01L 21/53266;
(Continued)

(56) References Cited

U.S. PATENT DOCUMENTS 5,387,550 A * 2/1995 Cheffings .......... H01L 21/76877
                                                  438/668
9,929,249 B1 * 3/2018 Ahn .................. H01L 21/76829
(Continued)

FOREIGN PATENT DOCUMENTS

KR    20150009936 A    1/2015
KR    20190042758 A    4/2019
(Continued)

OTHER PUBLICATIONS

International Search Report and Written Opinion dated Oct. 4, 2023 for Application No. PCT/US2023/025149.

(Continued)

*Primary Examiner* — Dale E Page
*Assistant Examiner* — Quovaunda Jefferson
(74) *Attorney, Agent, or Firm* — Patterson + Sheridan, LLP (57) ABSTRACT

A method of forming an oxidation barrier layer in a semiconductor structure includes forming a contact layer on an exposed surface of a semiconductor region of a semiconductor structure in a first processing chamber, wherein the semiconductor region comprises silicon germanium doped with p-type dopants and the contact layer comprises silicon germanium (SiGe) with a ratio of germanium (Ge) ranging between 60% and 100%, and forming an oxidation barrier layer comprising gallium (Ga) on the contact layer, by applying gallium (Ga)-containing liquid precursor to a surface of the contact layer in the first processing chamber.

20 Claims, 6 Drawing Sheets

(58) Field of Classification Search
CPC ......... H01L 21/02063; H01L 21/28525; H01L 21/76814; H01L 21/76843; H01L 21/28518; H01L 21/28556
See application file for complete search history.

(56) References Cited

U.S. PATENT DOCUMENTS

| | | |
|---|---|---|
| 2010/0327449 A1 | 12/2010 | Furusawa et al. |
| 2016/0190249 A1 | 6/2016 | Hsieh et al. |
| 2019/0288091 A1 | 9/2019 | Dennard et al. |
| 2020/0152763 A1 | 5/2020 | Cheng et al. |
| 2020/0303250 A1* | 9/2020 | Cen .................. H01L 21/32136 |
| 2021/0285102 A1 | 9/2021 | Yoon et al. |

FOREIGN PATENT DOCUMENTS

| | | |
|---|---|---|
| KR | 20210055139 A | 5/2021 |
| TW | 201521096 A | 6/2015 |
| WO | 2012018473 A2 | 2/2012 |

OTHER PUBLICATIONS

Taiwan Office Action dated Aug. 8, 2025 for Application No. 112122566.
Korean Office Action dated Oct. 14, 2025 for Application No. 10-2025-7004211.

* cited by examiner

OXIDATION BARRIERS WITH CVD SOAK PROCESSES

CROSS-REFERENCE TO RELATED APPLICATIONS

This application claims priority to U.S. Provisional Application Ser. No. 63/388,729 filed Jul. 13, 2022, which is herein incorporated by reference in its entirety.

BACKGROUND

Field

Embodiments described herein generally relate to semiconductor device fabrication, and more particularly, to systems and methods of forming a contact within a semiconductor structure.

Description of the Related Art

Multi-gate metal-oxide-semiconductor field-effect transistors (MOSFETs), such as complementary metal-oxide semiconductor (CMOS) devices, pose challenges in manufacturability due to their three-dimensional (3D) designs and small sizes. In advanced CMOS devices, an epitaxial layer of silicon-containing material (e.g., boron-doped p-type silicon germanium or phosphorus-doped n-type silicon) formed at a bottom of a trench contact is often utilized to lower a contact resistivity into the $10^{-9}$ $\Omega \cdot cm^2$ regime, and achieve the required performance for advanced CMOS technologies. Typically, a p-type epitaxial layer is formed of silicon germanium (SiGe) with a high germanium (Ge) concentration, for example, about 60% and about 80%, or 100% in certain cases, in order to minimize a contact resistance. However, an epitaxial layer of silicon germanium (SiGe) with a high germanium (Ge) concentration is known to undergo fast surface oxidation in atmospheric ambient, leading to formation of germanium oxide and suboxides. These oxide layers can lead to residual oxygen at the interface between the epitaxial layer of silicon germanium (SiGe) and a silicide metal layer formed over the epitaxial layer, increasing the contact resistivity. These oxide layers may be removed by sputtering-based pre-clean processes, which can lead to adverse effects, such as crystalline defect creation, dopant deactivation, and material removal in the epitaxial layer, all leading to a degradation of the electrical performance. The sputtering-based pre-clean processes also can result in a degradation of surrounding dielectric structures (e.g. enlargement of trench critical dimension (CD), top corner rounding).

Therefore, there is a need for methods and systems that can prevent or delay oxidation of a portion of a semiconductor device of silicon germanium (SiGe) with a high germanium (Ge) concentration in atmospheric ambient.

SUMMARY

Embodiments of the present disclosure provide a method of forming an oxidation barrier layer in a semiconductor structure. The method includes forming a contact layer on an exposed surface of a semiconductor region of a semiconductor structure in a first processing chamber, wherein the semiconductor region comprises silicon germanium doped with p-type dopants and the contact layer comprises silicon germanium (SiGe) with a ratio of germanium (Ge) ranging between 60% and 100%, and forming an oxidation barrier layer comprising gallium (Ga) on the contact layer, by applying gallium (Ga)-containing liquid precursor to a surface of the contact layer in the first processing chamber.

Embodiments of the present disclosure also provide a method of forming an electrical contact in a semiconductor structure. The method includes performing a pre-clean process on an exposed surface of a semiconductor region comprising a first material, wherein the exposed surface of the semiconductor region is disposed within an opening formed in a dielectric layer disposed over the semiconductor region, performing a selective epitaxial deposition process comprising a first deposition process and a first etch process, to form a contact layer comprising a second material on the exposed surface of the semiconductor region, performing a soak process, to form an oxidation barrier layer on the contact layer, performing a second deposition process, to form a metal layer on the oxidation barrier layer, and performing a metal fill process, to form a contact plug in the opening in the dielectric layer, wherein the selective epitaxial deposition process and the soak process are performed without breaking vacuum environment.

Embodiments of the present disclosure further provide a processing system. The processing system includes a first processing chamber, and a system controller configured to cause the processing system to form, in the first processing chamber, a contact layer on an exposed surface of a semiconductor region of a semiconductor structure, the semiconductor region comprises silicon germanium doped with p-type dopants and the contact layer comprises silicon germanium (SiGe) with a ratio of germanium (Ge) ranging between 60% and 100%, and form, in the first processing chamber, an oxidation barrier layer comprising gallium (Ga) on the contact layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The embodiments described herein provide methods and systems for forming a contact that includes an epitaxial layer of silicon-containing material (e.g., boron-doped p-type silicon germanium) having an oxidation barrier layer thereon at a selected portion (e.g., on an exposed surface of a layer of silicon germanium) of a structure that is used to form a CMOS device. The methods and systems may be particularly useful for forming, in a semiconductor structure having a region that includes silicon germanium and a dielectric layer formed thereover, an epitaxial layer that includes silicon germanium with high germanium concentration selectively on an exposed surface of the silicon germanium material within an opening or feature (e.g., contact trench) formed in the dielectric layer. Unlike conventional processes that require etch processes to remove oxides of germanium on a surface of the epitaxial layer, after exposed in atmospheric ambient, which tend to damage the fabricated semiconductor structures, the processes described herein are configured to form an oxidation barrier layer over the epitaxial layer, which avoids or delays oxidation of the epitaxial layer in atmospheric ambient during a transition from an epitaxy process into a subsequent process, such as silicidation, patterning.

Figure 1:
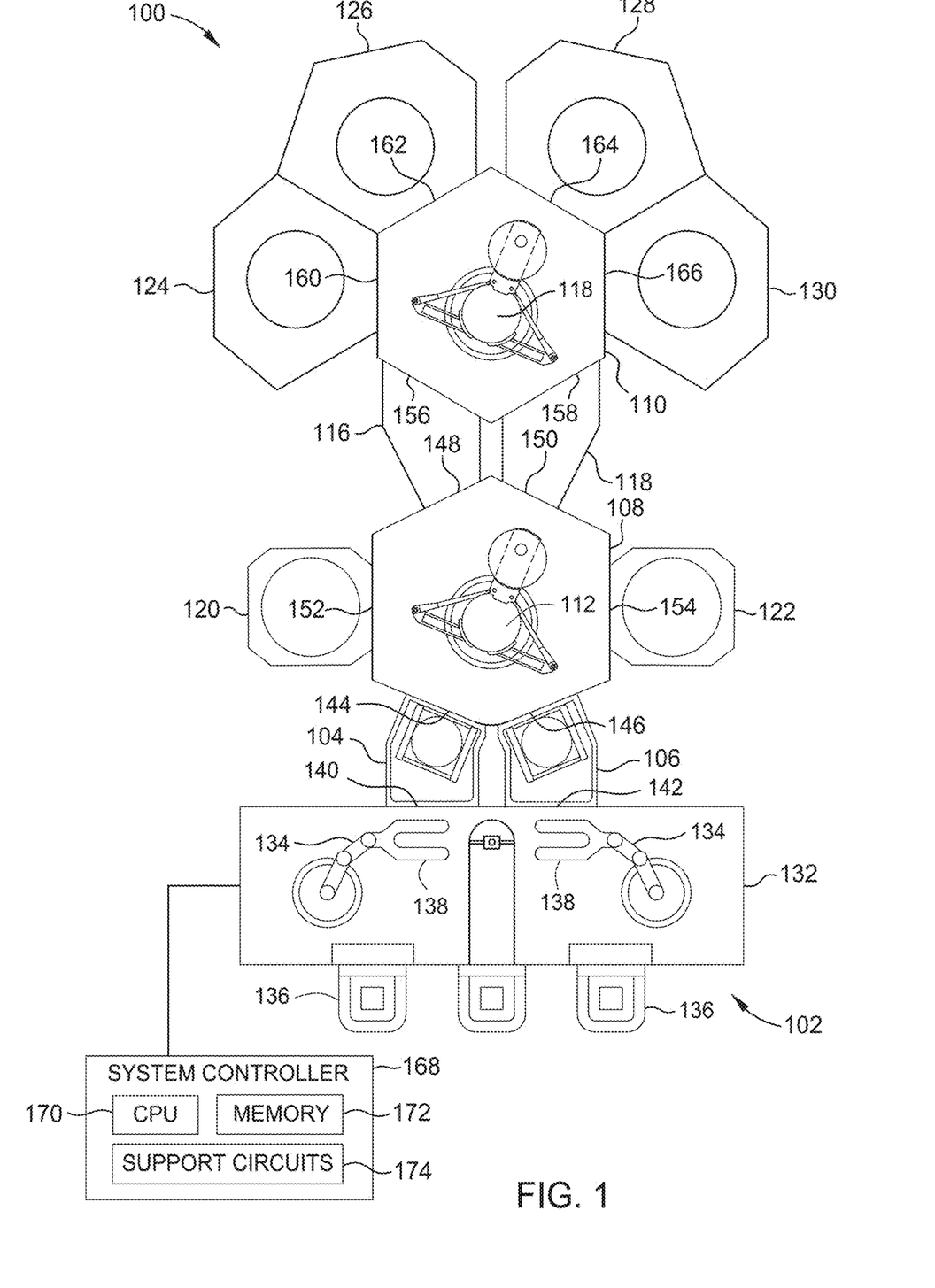
FIG. 1 is a schematic top view of a multi-chamber processing system according to one or more embodiments of the present disclosure.

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing an etch process, the processing chamber 122 can be capable of performing a cleaning process, and the processing chambers 126, 128, 130 can be capable of performing respective epitaxial growth processes. The processing chamber 120 may be a Selectra™ Etch chamber available from Applied Materials of Santa Clara, Calif. The processing chamber 122 may be a SiCoNi™ Pre-clean chamber available from Applied Materials of Santa Clara, Calif. The processing chamber 126, 128, or 130 may be a Centura™ Epi chamber available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2A:
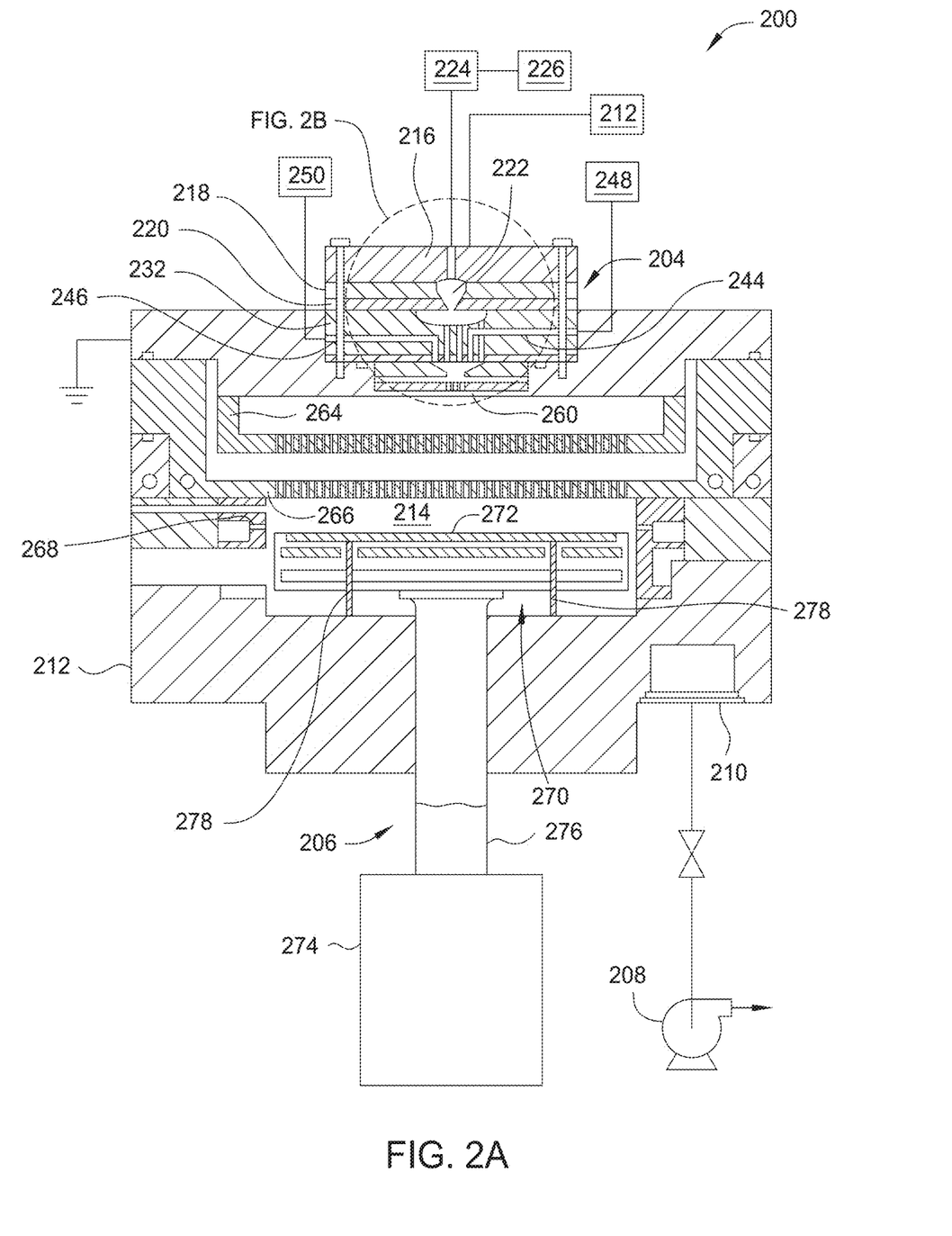
FIG. 2A is a cross sectional view of a processing chamber, according to one or more embodiments.
Figure 2B:
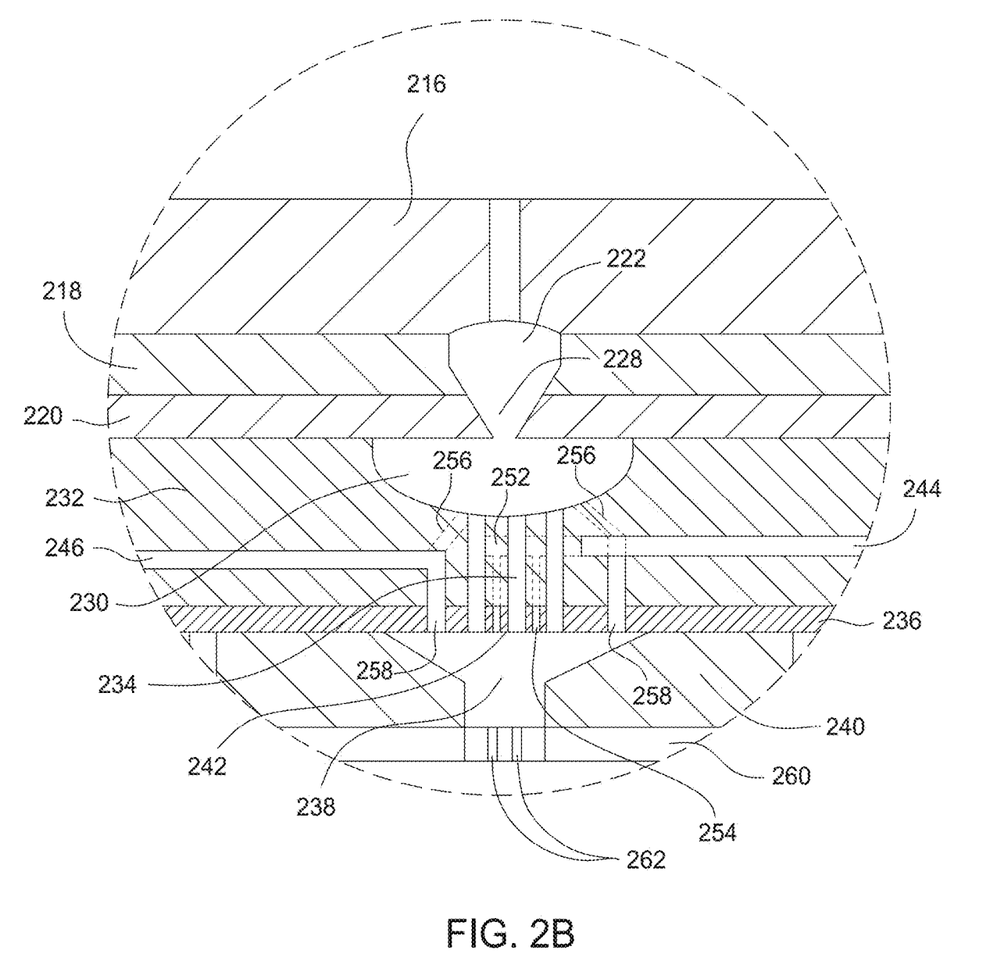
FIG. 2B is an enlarged view of a portion of the processing chamber of FIG. 2A.

FIG. 2A is a cross sectional view of a processing chamber 200, according to one or more embodiments, that is adapted to perform a pre-clean process as detailed below. The processing chamber 200 may be the processing chamber 122 shown in FIG. 1. FIG. 2B is an enlarged view of a portion of the processing chamber 200 of FIG. 2A.

The processing chamber 200 may be particularly useful for performing a thermal or plasma-based cleaning process and/or a plasma assisted dry etch process. The processing chamber 200 includes a chamber body 202, a lid assembly 204, and a support assembly 206. The lid assembly 204 is disposed at an upper end of the chamber body 202, and the support assembly 206 is at least partially disposed within the chamber body 202. A vacuum system can be used to remove gases from processing chamber 200. The vacuum system includes a vacuum pump 208 coupled to a vacuum port 210 disposed in the chamber body 202. The processing chamber 200 also includes a controller 212 for controlling processes within the processing chamber 200.

The lid assembly 204 includes stacked components adapted to provide precursor gases and/or a plasma to a processing region 214 within the processing chamber 200. A first plate 216 is coupled to a second plate 218. A third plate 220 is coupled to the second plate 218. The lid assembly 204 may be connected to a power source (not shown) for supplying a plasma to a cone-shaped chamber 222 formed in the lid assembly 204. The lid assembly 204 can also be connected to a remote plasma source 224 that creates the plasma upstream of the lid stack. The remote plasma cavity (e.g., the processing region 214, the first plate 216, and the second plate 218 in FIGS. 2A-2B) is coupled to a gas source 226 via the remote plasma source 224 (or the gas source 226 is coupled directly to the lid assembly 204 in the absence of the remote plasma source 224). The gas source 226 may include a gas source that is adapted to provide helium, argon, or other inert gas. In some configurations, the gas provided by the gas source 226 can be energized into a plasma that is provided to the lid assembly 204 by use of the remote plasma source 224. In alternate embodiments, the gas source 226 may provide process gases that can be activated by the remote plasma source 224 prior to being introduced to a surface of the substrate that is disposed within the processing chamber 200. Referring to FIG. 2B, the cone-shaped chamber 222 has an opening 228 that allows a formed plasma to flow from the remote plasma source 224 to a volume 230 formed in a fourth plate 232 of the lid assembly 204.

In some configurations of the lid assembly 204, a plasma is generated within the cone-shaped chamber 222 by the application of energy delivered from a plasma source. In one example, the energy can be provided by biasing the lid assembly 204 to capacitively couple RF, VHF and/or UHF energy to the gases positioned in the cone-shaped chamber 222. In this configuration of the lid assembly 204, the remote plasma source 224 may not be used, or not be installed within the lid assembly 204.

A central conduit 234, which is formed in the fourth plate 232, is adapted to provide the plasma generated species provided from the volume 230 through a fifth plate 236 to a mixing chamber 238 formed in a sixth plate 240 of the lid assembly 204. The central conduit 234 communicates with the mixing chamber 238 through an opening 242 in the fifth plate 236. The opening 242 may have a diameter less than, greater than or the same as a diameter of the central conduit 234. In the embodiment of FIG. 2B, the opening 242 has diameter the same as the central conduit 234.

The fourth plate 232 also includes inlets 244 and 246 that are adapted to provide gases to the mixing chamber 238. The inlet 244 is coupled to a first gas source 248 and the inlet 246 is coupled to a second gas source 250. The first gas source 248 and the second gas source 250 may include processing gases as well as inert gases, for example inert gases such as argon and/or helium, utilized as a carrier gas. The first gas source 248 may include ammonia ($NH_3$) as well as argon (Ar). The second gas source 250 may contain fluorine containing gases, hydrogen containing gases, or a combination thereof. In one example, the second gas source 250 may contain hydrogen fluoride (HF) as well as argon (Ar).

As illustrated in FIG. 2B, in some configurations, the inlet 244 is coupled to the mixing chamber 238 through a cylindrical channel 252 (shown in phantom) and holes 254 formed in the fifth plate 236. The inlet 246 is coupled to the mixing chamber 238 through a cylindrical channel 256 (shown in phantom) and holes 258 formed in the fifth plate 236. The holes 254, 258 formed in the fifth plate 236 are generally sized so that they enable a uniform flow of gases, which are provided from their respective gas source 248, 250, into the mixing chamber 238. In one configuration, the holes 258 have a diameter that is less than a width of the opening defined by the opposing sidewalls of the cylindrical channel 256 formed in the fourth plate 232. The holes 258 are typically distributed around the circumference of the center-line of the cylindrical channel 256 to provide uniform fluid flow into the mixing chamber 238. In one configuration, the holes 254 have a diameter that is less than a width of the opening defined by the opposing sidewalls of the cylindrical channel 252 formed the fourth plate 232. The holes 254 are typically distributed around the circumference of the center-line of the cylindrical channel 252 to provide uniform fluid flow into the mixing chamber 238.

The inlets 244 and 246 provide respective fluid flow paths laterally through the fourth plate 232, turning toward and penetrating through the fifth plate 236 to the mixing chamber 238. The lid assembly 204 also includes a seventh plate or first gas distributor 260, which may be a gas distribution plate, such as a showerhead, where the various gases mixed in the lid assembly 204 are flowed through perforations 262 formed therein. The perforations 262 are in fluid communication with the mixing chamber 238 to provide flow pathways from the mixing chamber 238 through the first gas distributor 260. Referring back to FIG. 2A, a blocker plate 264 and a gas distribution plate, such as a second gas distributor 266, which may be a gas distribution plate, such as a showerhead, is disposed below the lid assembly 204.

Alternatively, a different cleaning process may be utilized to clean the substrate surface. For example, a remote plasma containing helium (He) and ammonia ($NH_3$) may be introduced into the processing chamber 200 through the lid assembly 204, while ammonia ($NH_3$) may be directly injected into the processing chamber 200 via a separate gas inlet 268 that is disposed at a side of the chamber body 202 and coupled to a gas source (not shown).

The support assembly 206 may include a substrate support 270 to support a substrate 272 thereon during processing. The substrate support 270 may be coupled to an actuator 274 by a shaft 276 which extends through a centrally-located opening formed in a bottom of the chamber body 202. The actuator 274 may be flexibly sealed to the chamber body 202 by bellows (not shown) that prevent vacuum leakage around the shaft 276. The actuator 274 allows the substrate support 270 to be moved vertically within the chamber body 202 between a processing position and a loading position. The loading position is slightly below the opening of a tunnel (not shown) formed in a sidewall of the chamber body 202.

The substrate support 270 has a flat, or a substantially flat, substrate supporting surface for supporting a substrate 272 to be processed thereon. The substrate support 270 may be moved vertically within the chamber body 202 by the actuator 274, which is coupled to the substrate support 270 by the shaft 276. For some process operations, the substrate support 270 may be elevated to a position in close proximity to the lid assembly 204 to control the temperature of the substrate 272 being processed. As such, the substrate 272 may be heated via radiation emitted from the second gas distributor 266, or another radiant source, or by convection or conduction from the second gas distributor 266 through an intervening gas. In some process operations, the substrate may be disposed on lift pins 278 to perform additional thermal processing steps, such as performing an annealing step.

Figure 3:
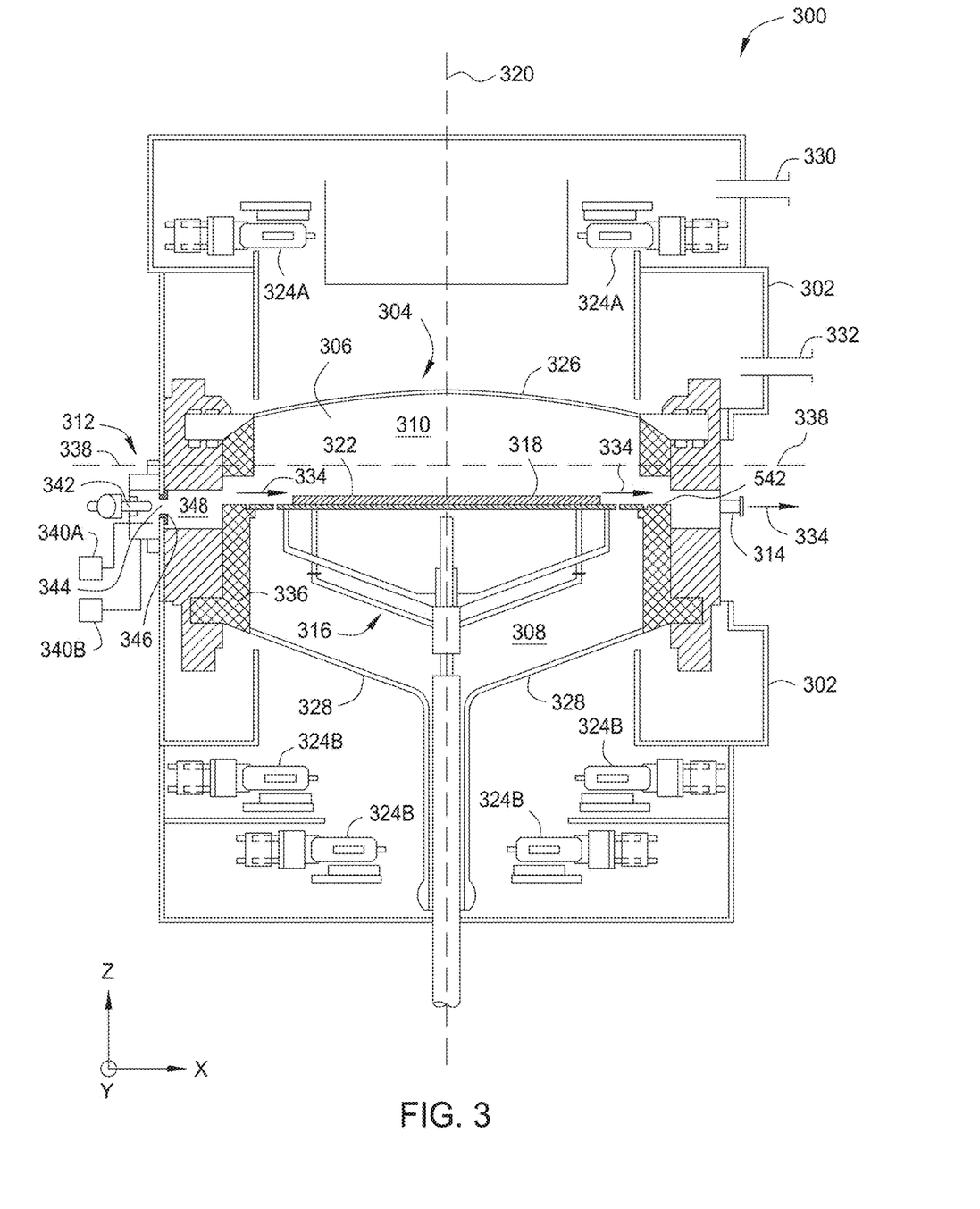
FIG. 3 is a cross sectional view of a processing chamber, according to one or more embodiments.

FIG. 3 is a cross sectional view of a processing chamber 300, according to one or more embodiments, that is adapted to perform an epitaxial (Epi) deposition process as detailed below. The processing chamber 300 may be the processing chamber 126, 128, or 130 shown in FIG. 1.

The processing chamber 300 includes a housing structure 302 made of a process resistant material, such as aluminum or stainless steel, for example 316L stainless steel. The housing structure 302 encloses various functioning elements of the processing chamber 300, such as a quartz chamber 304, which includes an upper quartz chamber 306, and a lower quartz chamber 308, in which a processing volume 310 is contained. Reactive species are provided to the quartz chamber 304 by a gas distribution assembly 312, and processing byproducts are removed from the processing volume 310 by an outlet port 314, which is typically in communication with a vacuum source (not shown).

A substrate support 316 is adapted to receive a substrate 318 that is transferred to the processing volume 310. The substrate support 316 is disposed along a longitudinal axis 320 of the processing chamber 300. The substrate support 316 may be made of a ceramic material or a graphite material coated with a silicon material, such as silicon carbide, or other process resistant material. Reactive species from precursor reactant materials are applied to a surface 322 of the substrate 318, and byproducts may be subsequently removed from the surface 322 of the substrate 318. Heating of the substrate 318 and/or the processing volume 310 may be provided by radiation sources, such as upper lamp modules 324A and lower lamp modules 324B.

In one embodiment, the upper lamp modules 324A and the lower lamp modules 324B are infrared (IR) lamps. Non-thermal energy or radiation from the lamp modules 324A and 324B travels through an upper quartz window 326 of the upper quartz chamber 306, and through a lower quartz window 328 of the lower quartz chamber 308. Cooling gases for the upper quartz chamber 306, if needed, enter through an inlet 330 and exit through an outlet 332. Precursor reactant materials, as well as diluent, purge and vent gases for the processing chamber 300, enter through the gas distribution assembly 312 and exit through the outlet port 314. While the upper quartz window 326 is shown as being curved or convex, the upper quartz window 326 may be planar or concave as the pressure on both sides of the upper quartz window 326 is substantially the same (i.e., atmospheric pressure).

The low wavelength radiation in the processing volume 310, which is used to energize reactive species and assist in adsorption of reactants and desorption of process byproducts from the surface 322 of the substrate 318, typically ranges from about 0.8 µm to about 1.2 µm, for example, between about 0.95 µm to about 1.05 µm, with combinations of various wavelengths being provided, depending, for example, on the composition of the film which is being epitaxially grown.

The component gases enter the processing volume 310 via the gas distribution assembly 312. Gas flows from the gas distribution assembly 312 and exits through the outlet port 314 as shown generally by a flow path 334. Combinations of component gases, which are used to clean/passivate a substrate surface, or to form the silicon and/or germanium-containing film that is being epitaxially grown, are typically mixed prior to entry into the processing volume 310. The overall pressure in the processing volume 310 may be adjusted by a valve (not shown) on the outlet port 314. At least a portion of the interior surface of the processing volume 310 is covered by a liner 336. In one embodiment, the liner 336 comprises a quartz material that is opaque. In this manner, the chamber wall is insulated from the heat in the processing volume 310.

The temperature of surfaces in the processing volume 310 may be controlled within a temperature range of about 200° C. to about 600° C., or greater, by the flow of a cooling gas, which enters through the inlet 330 and exits through the outlet 332, in combination with radiation from the upper lamp modules 324A positioned above the upper quartz window 326. The temperature in the lower quartz chamber 308 may be controlled within a temperature range of about 200° C. to about 600° C. or greater, by adjusting the speed of a blower unit which is not shown, and by radiation from the lower lamp modules 324B disposed below the lower quartz chamber 308. The pressure in the processing volume 310 may be between about 0.1 Torr to about 600 Torr, such as between about 5 Torr to about 30 Torr.

The temperature on the surface 322 of the substrate 318 may be controlled by power adjustment to the lower lamp modules 324B in the lower quartz chamber 308, or by power adjustment to both the upper lamp modules 324A overlying the upper quartz window 326, and the lower lamp modules 324B in the lower quartz chamber 308. The power density in the processing volume 310 may be between about 40 W/cm$^2$ to about 400 W/cm$^2$, such as about 80 W/cm$^2$ to about 120 W/cm$^2$.

In one aspect, the gas distribution assembly 312 is disposed normal to, or in a radial direction 338 relative to, the longitudinal axis 320 of the processing chamber 300 or the substrate 318. In this orientation, the gas distribution assembly 312 is adapted to flow process gases in the radial direction 338 across, or parallel to, the surface 322 of the substrate 318. In one processing application, the process gases are preheated at the point of introduction to the processing chamber 300 to initiate preheating of the gases prior to introduction to the processing volume 310, and/or to break specific bonds in the gases. In this manner, surface reaction kinetics may be modified independently from the thermal temperature of the substrate 318.

In operation, precursors used to form silicon (Si) and silicon germanium (SiGe) blanket or selective epitaxial films are provided to the gas distribution assembly 312 from one or more gas sources 340A and 340B. IR lamps 342 (only one is shown in FIG. 3) may be utilized to heat the precursors within the gas distribution assembly 312 as well as along the flow path 334. The gas sources 340A, 340B may be coupled the gas distribution assembly 312 in a manner adapted to facilitate introduction zones within the gas distribution assembly 312, such as a radial outer zone and a radial inner zone between the outer zones when viewed in from a top plan view. The gas sources 340A, 340B may include valves (not shown) to control the rate of introduction into the zones.

The gas sources 340A, 340B may include silicon precursors such as silanes, including silane (SiH$_4$), disilane (Si$_2$H$_6$), dichlorosilane (SiH$_2$Cl$_2$), hexachlorodisilane (Si$_2$Cl$_6$), dibromosilane (SiH$_2$Br$_2$), higher order silanes, derivatives thereof, and combinations thereof. The gas sources 340A, 340B may also include germanium containing precursors, such as germane (GeH$_4$), digermane (Ge$_2$H$_6$), germanium tetrachloride (GeCl$_4$), dichlorogermane (GeH$_2$Cl$_2$), derivatives thereof, and combinations thereof. The silicon and/or germanium containing precursors may be used in combination with hydrogen chloride (HCl), chlorine gas (Cl$_2$), hydrogen bromide (HBr), and combinations thereof. The gas sources 340A, 340B may include one or more of the silicon and germanium containing precursors in one or both of the gas sources 340A, 340B.

The precursor materials enter the processing volume 310 through openings or holes 344 (only one is shown in FIG. 3) in the perforated plate 346 in this excited state, which in one embodiment is a quartz material, having the holes 344 formed therethrough. The perforated plate 346 is transparent to IR energy, and may be made of a clear quartz material. In other embodiments, the perforated plate 346 may be any material that is transparent to IR energy and is resistant to process chemistry and other processing chemistries. The energized precursor materials flow toward the processing volume 310 through the holes 344 in the perforated plate 346, and through channels 348 (only one is shown in FIG. 3). A portion of the photons and non-thermal energy from the IR lamps 342 also passes through the holes 344, the perforated plate 346, and channels 348 facilitated by a reflective material and/or surface disposed on the interior surfaces of the gas distribution assembly 312, thereby illuminating the flow path 334 of the precursor materials. In this manner, the vibrational energy of the precursor materials may be maintained from the point of introduction to the processing volume 310 along the flow path.

Figure 4:
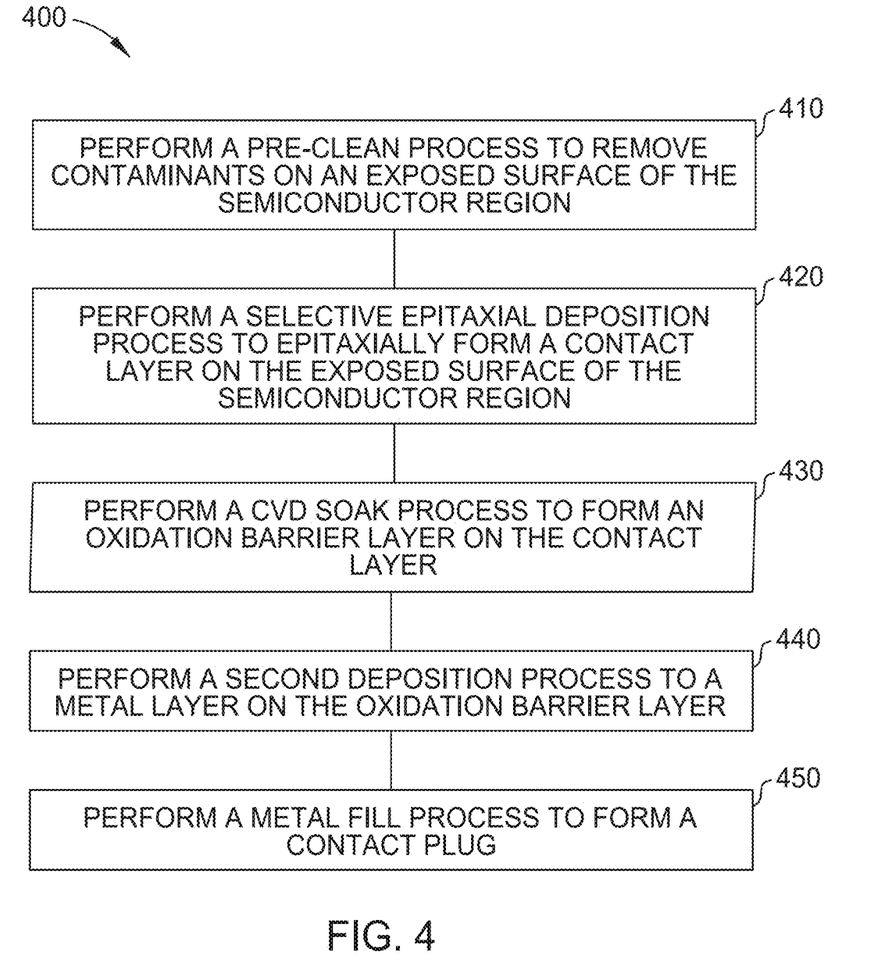
FIG. 4 depicts a process flow diagram of a method of forming a contact layer in a semiconductor structure according to one or more embodiments of the present disclosure.

FIG. 4 depicts a process flow diagram of a method 400 of forming a contact layer in a semiconductor structure 500 formed on a substrate according to one embodiment of the present disclosure. FIGS. 5A, 5B, 5C, 5D, and 5E are cross-sectional views of a portion of the semiconductor structure 500 corresponding to various states of the method 400. It should be understood that FIGS. 5A, 5B, 5C, 5D, and 5E illustrate only partial schematic views of the semiconductor structure 500, and the semiconductor structure 500 may contain any number of transistor sections and additional materials having aspects as illustrated in the figures. It should also be noted that although the method illustrated in FIG. 4 is described sequentially, other process sequences that include one or more operations that have been omitted and/or added, and/or has been rearranged in another desirable order, fall within the scope of the embodiments of the disclosure provided herein.

The term "substrate" as used herein refers to a layer of material that serves as a basis for subsequent processing operations and includes a surface to be cleaned. The substrate may be a silicon based material or any suitable insulating materials or conductive materials as needed. The substrate may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire.

Figure 5A:
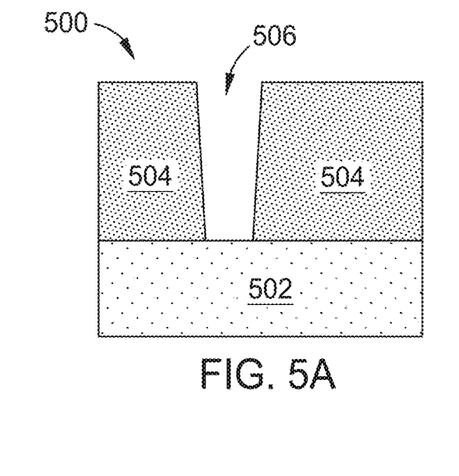
FIGS. 5A, 5B, 5C, 5D, and 5E are cross-sectional views of a portion of a semiconductor structure corresponding to various states of the method of FIG. 4.

As shown in FIG. 5A, the semiconductor structure 500 includes a semiconductor region 502 formed on a substrate (not shown). The semiconductor region 502 may be formed of a first material such as silicon germanium (SiGe) or germanium tin (GeSn), and doped with p-type dopants such as boron (B) or gallium (Ga), with the concentration of between about 10$^{20}$ cm$^{-3}$ and 5·×10$^{21}$ cm$^{-3}$.

The semiconductor structure 500 further includes a dielectric layer 504 having an opening 506 formed over the semiconductor region 502. The dielectric layer 504 may be formed of a dielectric material, such as silicon dioxide (SiO$_2$) or silicon nitride (Si$_3$N$_4$).

The semiconductor region 502 may be formed using any suitable deposition technique, such as epitaxial (Epi) deposition, chemical vapor deposition (CVD), atomic layer deposition (ALD), or physical vapor deposition (PVD), and the opening 506 may be formed by a patterning technique, such as a lithography and etch process.

The method 400 begins with a pre-clean process in block 410. The pre-clean process may be performed in an etch chamber, such as the processing chamber 122 shown in FIG. 1, or the processing chamber 200 shown in FIG. 2.

The pre-clean process removes contaminants, such as native oxide layers, or patterning residues (e.g., fluorocarbons) formed on an exposed surface of the semiconductor region 502 within the opening 506. The pre-clean process is used to prepare the exposed surface of the semiconductor region 502 within the opening 506 on which an epitaxial layer can be formed in a subsequent epitaxial deposition process.

The pre-clean process may include an anisotropic remote plasma assisted dry etch process, such as a reactive ion etching (RIE) process, using a plasma formed from a gas including argon (Ar), helium (He), or a combination thereof. The plasma effluents directionally bombard and remove a remaining dielectric layer within the opening 506.

The pre-clean process may include an isotropic plasma etching process, such as a SiCoNi™ dry chemical etching process, using a plasma formed from a gas including ammonia ($NH_3$), nitrogen trifluoride ($NF_3$), hydrogen fluoride (HF), or a combination thereof, and a carrier gas, such as nitrogen ($N_2$), hydrogen ($H_2$), or a combination thereof. The dry chemical etching process is selective for oxide layers, and thus does not readily etch silicon, germanium, or nitride layers regardless of whether the layers are amorphous, crystalline, or polycrystalline. Selectivity of the dry chemical etching process for oxide versus silicon or germanium is at least about 3:1, and usually 5:1 or better, sometimes 10:1. The dry chemical etching process is also highly selective of oxide versus nitride. The selectivity of the dry chemical etching process versus nitride is at least about 3:1, usually 5:1 or better, sometimes 10:1.

The pre-clean process may include an inductively coupled plasma (ICP) etching process, using a plasma formed from a gas including chlorine ($Cl_2$) and hydrogen ($H_2$), and a carrier gas including argon (Ar) and helium (He).

Figure 5B:
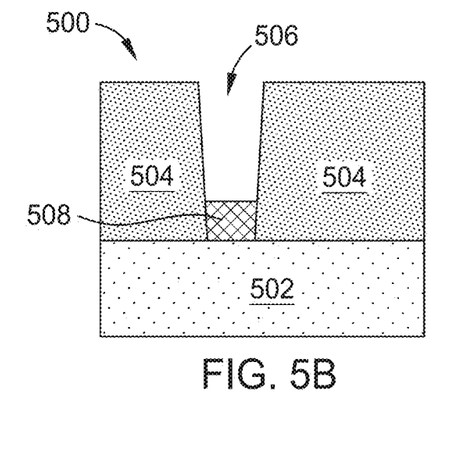

In block 420, a selective epitaxial deposition process is performed to epitaxially form a contact layer 508 on the exposed surface of the semiconductor region 502 within the opening 506, as shown in FIG. 5B. The selective epitaxial deposition process may be performed in an epi chamber, such as the processing chamber 126, 128, or 130 shown in FIG. 1, or the processing chamber 300 shown in FIG. 3.

The contact layer 508 is formed as interfaces between the semiconductor region 502 and a metal contact plug to be formed within the opening 506, to minimize parasitic resistance. The contact layer 508 may be formed of a second material, such as silicon germanium (SiGe) with a ratio of germanium (Ge) ranging between about 20% and about 100%, for example, between about 60% and about 80%, between about 60% and about 100%, or between about 80% and about 100%. The contact layer 508 may be doped with p-type dopants such as boron (B) or gallium (Ga), with the concentration of between about $10^{20}$ cm$^{-3}$ and $5 \times 10^{21}$ cm$^{-3}$, depending upon the desired conductive characteristic of the contact layer 508.

In some embodiments, the selective epitaxial deposition process includes a first deposition process and a first etch process. The first deposition process is an epitaxial deposition process. The selectivity in the selective epitaxial deposition process may arise from differences in nucleation of the second material on the exposed surface of the semiconductor region 502 (e.g., silicon germanium (SiGe)) from that on exposed surfaces of the dielectric layer 504 (e.g., silicon dioxide ($SiO_2$) or silicon nitride ($Si_3N_4$)). The nucleation may occur at a faster rate on the exposed surface of the semiconductor region 502 (e.g., silicon germanium (SiGe)) than on the exposed surfaces of the dielectric layer 504 (e.g., silicon dioxide ($SiO_2$) or silicon nitride ($Si_3N_4$)), and thus an epitaxial layer of the second material may be formed on the exposed surface of the semiconductor region 502 (e.g., silicon germanium (SiGe)), while an amorphous layer of the second material may be formed on the exposed surfaces of the dielectric layer 504 (e.g., silicon dioxide ($SiO_2$) or silicon nitride ($Si_3N_4$)), when the semiconductor structure 500 is exposed to a deposition gas in the first deposition process. In the subsequent first etch process, the amorphous layers of the second material formed on the exposed surfaces of the dielectric layer 504 can be removed at a faster rate than the epitaxial layers of the second material formed on the exposed surface of the semiconductor region 502, by an appropriate etching gas. Thus, an overall result of the first deposition process and the first etch process combined can be epitaxial growth of the second material on the exposed surface of the semiconductor region 502, while minimizing growth, if any, of the second material on the exposed surfaces of the dielectric layer 504.

In some embodiments, the deposition gas includes a silicon-containing precursor, a germanium containing precursor, and a dopant source. The silicon-containing precursor may include silane ($SiH_4$), disilane ($Si_2H_6$), tetrasilane ($Si_4H_{10}$), or a combination thereof. The germanium-containing precursor may include germane ($GeH_4$), germanium tetrachloride ($GeCl_4$), and digermane ($Ge_2H_6$). The dopant source may include, for example, boron, or gallium, depending upon the desired conductive characteristic of the contact layer 508. The dopant source may include a precursor diborane ($B_2H_6$). The etching gas includes an etchant gas and a carrier gas. The etchant gas may include halogen-containing gas, such as hydrogen chloride (HCl), chlorine ($Cl_2$), or hydrogen fluoride (HF). The carrier gas may include nitrogen ($N_2$), argon (Ar), helium (He), or hydrogen ($H_2$).

The first deposition process and the first etch process may be performed at a low temperature less than about 450° C. and at a pressure of between 5 Torr and 600 Torr.

A cycle of the first deposition and first etch processes may be repeated as needed to obtain a desired thickness of the contact layer 508. A thickness of the contact layer 508 may be between about 30 Å and about 100 Å.

Figure 5C:
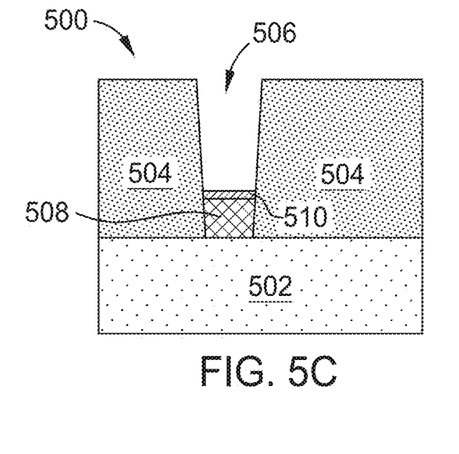

In block 430, a CVD soak process is performed to form an oxidation barrier layer 510 on the contact layer 508, as shown in FIG. 5C. The CVD soak process may be performed in situ within the same epi chamber as in the selective epitaxial deposition process in block 420, such as the processing chamber 126, 128, or 130 shown in FIG. 1, or the processing chamber 300 shown in FIG. 3.

In the CVD soak process, a surface of the contact layer 508 is exposed to a gallium (Ga)-containing liquid precursor at a temperature within a range from about 300° C. to about 400° C., to form a thin gallium-layer (e.g., the oxidation barrier layer 510) on the contact layer 508. The processing chamber or the semiconductor structure 500 may be heated to a temperature within a range from about 300° C. to about 400° C. The CVD soak process may last for a time period of about 1 second to about 60 seconds, for example, from about 2 seconds to about 30 seconds. In the CVD soak process, gallium atoms in the gallium-containing liquid precursor diffuse and deposit on the surface of the contact layer 508 to form a thin gallium layer. This thin gallium layer may act as the oxidation barrier layer 510 and avoid or delay oxidation of the contact layer 508, during an air break to transfer the semiconductor structure 500 out of the epi chamber into another processing chamber for subsequent process, such as a deposition process in block 440 or a patterning process.

Figure 5D:
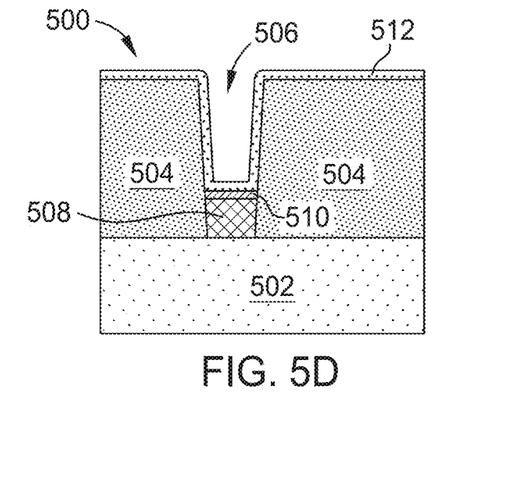

In block 440, a second deposition process is performed, as shown in FIG. 5D. The second deposition process may be performed in a different processing chamber from the epi chamber in blocks 420 and 430, such as the processing chamber 126, 128, or 130 shown in FIG. 1, or the processing chamber 300 shown in FIG. 3. The semiconductor structure 500 may be exposed to atmosphere during the transfer from the epi chamber used in blocks 420 and 430 to the processing chamber used in block 440. However, the contact layer 508 may be protected from oxidation during the transfer, or its oxidation is delayed, due to the oxidation barrier layer 510 thereon.

In the second deposition process, a metal layer 512 is formed on the oxidation barrier layer 510. The metal layer 512 contacts the contact layer 508 and provides an electrical connection between a contact plug to be formed within the opening 506 and the semiconductor region 602, while maintaining an electrical connection therethrough. The metal layer 512 may be formed of a metal material, such as titanium (Ti), cobalt (Co), nickel (Ni), molybdenum (Mo), or tantalum (Ta), or silicide thereof.

In some embodiments, the metal source may include a precursor that includes titanium (Ti), tantalum (Ta), cobalt (Co), nickel (Ni), or molybdenum (Mo) or combination thereof. The second deposition process may be each performed at a temperature of between about 300° C. and about 800° C. and at a pressure of between 1° Torr and 50° Torr.

The second deposition process performed in block 440 may include any appropriate deposition process, such as atomic layer deposition (ALD), chemical vapor deposition (CVD), physical vapor deposition (PVD), or the like, at a temperature of between about 100° C. and about 300° C.

Figure 5E:
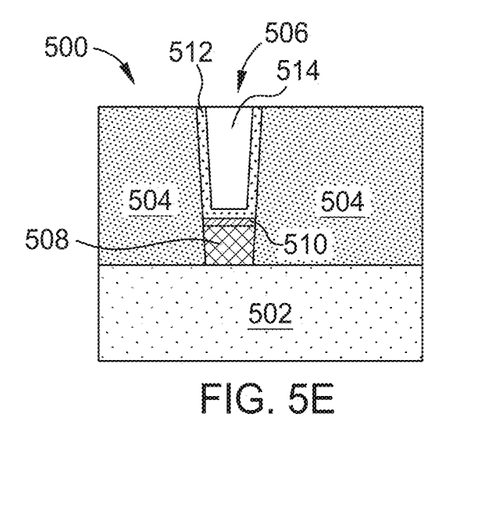

In block 450, a metal fill process is performed to form a contact plug 514 in the opening 506, as shown in FIG. 5E. The contact plug 514 may be formed of contact plug metal material, such as tungsten (W), cobalt (Co), ruthenium (Ru), or molybdenum (Mo). The contact plug 514 may include a metal that has a desirable work function. The metal fill process in block 450 may include a chemical vapor deposition (CVD) process using a tungsten-containing precursor, such as $WF_6$, or a cobalt-containing precursor, in a processing chamber, such as the processing chamber 126, 128, or 130 shown in FIG. 1.

After the metal fill process, the semiconductor structure 500 may be planarized, by use of a chemical mechanical planarization (CMP) process.

The embodiments described herein provide methods and system for forming a contact epitaxial layer having an oxidation barrier layer thereon within a trench on a semiconductor device. A contact trench structure includes a metal contact plug formed within the trench, and a contact that interface between the contact plug and a silicon-based channel in the semiconductor device. The contact is formed of silicon germanium with high germanium concentration by a selective epitaxial deposition process, reducing parasitic resistance. An oxidation barrier layer is formed of gallium (Ga) by a CVD soak process. The methods and systems do not require etch processes to remove oxides of germanium (Ge), and thus damages on a fabricated semiconductor structures are reduced.

While the foregoing is directed to embodiments of the present disclosure, other and further embodiments of the disclosure may be devised without departing from the basic scope thereof, and the scope thereof is determined by the claims that follow.

The invention claimed is:

1. A method of forming an oxidation barrier layer in a semiconductor structure, comprising:
    forming a contact layer on an exposed surface of a semiconductor region of a semiconductor structure in a first processing chamber, wherein the semiconductor region comprises silicon germanium doped with p-type dopants and the contact layer comprises silicon germanium (SiGe) with a ratio of germanium (Ge) ranging between 60% and 100%; and
    forming an oxidation barrier layer comprising gallium (Ga) on the contact layer, by applying gallium (Ga)-containing liquid precursor to a surface of the contact layer in the first processing chamber.

2. The method of claim 1, wherein the forming of the contact layer comprises:
    a selective epitaxial deposition of silicon germanium (SiGe) on the exposed surface of the semiconductor region.

3. The method of claim 1, wherein the applying of the gallium (Ga)-containing liquid precursor is performed at a temperature within a range from 300° C. to 400° C.

4. The method of claim 1, further comprising:
    prior to the forming of the contact layer, performing a pre-clean process on the exposed surface of the semiconductor region in a second processing chamber, wherein the exposed surface of the semiconductor region is disposed within an opening formed in a dielectric layer disposed over the semiconductor region; and
    subsequent to the forming of the oxidation barrier layer, performing a deposition process in a third processing chamber, to form a metal layer on the oxidation barrier layer.

5. The method of claim 4, further comprising:
    performing a metal fill process, to form a contact plug in the opening in the dielectric layer.

6. The method of claim 5, wherein
    the metal layer comprises material selected from titanium (Ti) silicide, cobalt (Co) silicide, nickel (Ni) silicide, molybdenum (Mo) silicide, and tantalum (Ta) silicide.

7. The method of claim 5, wherein
    the contact plug comprises material selected from tungsten (W), cobalt (Co), ruthenium (Ru), and molybdenum (Mo).

8. A method of forming an electrical contact in a semiconductor structure, comprising:
    performing a pre-clean process on an exposed surface of a semiconductor region comprising a first material, wherein the exposed surface of the semiconductor region is disposed within an opening formed in a dielectric layer disposed over the semiconductor region;
    performing a selective epitaxial deposition process comprising a first deposition process and a first etch process, to form a contact layer comprising a second material on the exposed surface of the semiconductor region;
    performing a soak process, to form an oxidation barrier layer on the contact layer;
    performing a second deposition process, to form a metal layer on the oxidation barrier layer; and
    performing a metal fill process, to form a contact plug in the opening in the dielectric layer,
    wherein the selective epitaxial deposition process and the soak process are performed without breaking vacuum environment.

9. The method of claim 8, wherein
    the first material comprises silicon germanium doped with p-type dopants.

10. The method of claim 8, wherein
    the second material comprises silicon germanium (SiGe) with a ratio of germanium (Ge) ranging between 60% and 100%.

11. The method of claim 8, wherein
the first deposition process comprises an epitaxial deposition of the second material on the exposed surface of the semiconductor region, and
the first etch process comprises an etch process to remove amorphous layers of the second material formed on exposed surfaces of the dielectric layer.

12. The method of claim 8, wherein
the soak process comprises applying gallium (Ga)-containing liquid precursor to a surface of the contact layer at a temperature within a range from 300° C. to 400° C., and
the oxidation barrier layer comprise gallium (Ga).

13. The method of claim 8, wherein
the metal layer comprises material selected from titanium (Ti) silicide, cobalt (Co) silicide, nickel (Ni) silicide, molybdenum (Mo) silicide, and tantalum (Ta) silicide.

14. The method of claim 8, wherein
the contact plug comprises material selected from tungsten (W), cobalt (Co), ruthenium (Ru), and molybdenum (Mo).

15. A processing system, comprising:
a first processing chamber; and
a system controller configured to cause the processing system to:
   form, in the first processing chamber, a contact layer on an exposed surface of a semiconductor region of a semiconductor structure, the semiconductor region comprises silicon germanium doped with p-type dopants and the contact layer comprises silicon germanium (SiGe) with a ratio of germanium (Ge) ranging between 60% and 100%; and
   form, in the first processing chamber, an oxidation barrier layer comprising gallium (Ga) on the contact layer.

16. The processing system of claim 15, wherein the forming of the oxidation barrier layer comprises applying gallium (Ga)-containing liquid precursor to a surface of the contact layer at a temperature within a range from 300° C. to 400° C.

17. The processing system of claim 15, further comprising:
a second processing chamber; and
a third processing chamber, wherein the system controller is further configured to cause the processing system to:
prior to the forming of the contact layer, perform a pre-clean process on the exposed surface of the semiconductor region in the second processing chamber, wherein the exposed surface of the semiconductor region is disposed within an opening formed in a dielectric layer disposed over the semiconductor region; and
subsequent to the forming of the oxidation barrier layer, performing a deposition process in the third processing chamber, to form a metal layer on the oxidation barrier layer.

18. The processing system of claim 17, further comprising:
a fourth processing chamber, wherein the system controller is further configured to cause the processing system to:
perform a metal fill process, to form a contact plug in the opening in the dielectric layer.

19. The processing system of claim 18, wherein
the metal layer comprises material selected from titanium (Ti) silicide, cobalt (Co) silicide, nickel (Ni) silicide, molybdenum (Mo) silicide, and tantalum (Ta) silicide.

20. The processing system of claim 18, wherein
the contact plug comprises material selected from tungsten (W), cobalt (Co), ruthenium (Ru), and molybdenum (Mo).

* * * * *